US012165834B2

(12) United States Patent
Katsap (10) Patent No.: US 12,165,834 B2
(45) Date of Patent: Dec. 10, 2024

(54) METHOD AND APPARATUS FOR SCHOTTKY TFE INSPECTION

(71) Applicants: NuFlare Technology, Inc., Kanagawa (JP); NuFlare Technology America, Inc., Sunnyvale, CA (US)

(72) Inventor: Victor Katsap, Hopewell Junction, NY (US)

(73) Assignees: NuFlare Technology, Inc., Kanagawa (JP); NuFlare Technology America, Inc., Sunnyvale, CA (US)

( * ) Notice: Subject to any disclaimer, the term of this patent is extended or adjusted under 35 U.S.C. 154(b) by 0 days.

(21) Appl. No.: 18/187,966

(22) Filed: Mar. 22, 2023

(65) Prior Publication Data
US 2023/0253178 A1 Aug. 10, 2023

Related U.S. Application Data

(62) Division of application No. 17/319,208, filed on May 13, 2021, now Pat. No. 11,640,896.

(51) Int. Cl.
*H01J 37/22* (2006.01)
*G01N 23/2251* (2018.01)
(Continued)

(52) U.S. Cl.
CPC ........ *H01J 37/222* (2013.01); *G01N 23/2251* (2013.01); *H01J 37/073* (2013.01);
(Continued)

(58) Field of Classification Search
CPC .......... H01J 37/00; H01J 37/02; H01J 37/222; H01J 37/073; H01J 37/12; H01J 37/224;
(Continued)

(56) References Cited

U.S. PATENT DOCUMENTS 5,517,033 A * 5/1996 Krivanek ............... H01J 37/224
250/397
5,923,034 A * 7/1999 Ogasawara ............. H01J 37/26
250/397
(Continued)

FOREIGN PATENT DOCUMENTS

KR 10-2019-0134103 A 12/2019

OTHER PUBLICATIONS

Combined Taiwanese Office Action and Search Report issued Mar. 6, 2023, in corresponding Taiwanese Patent Application No. 111110840 (with English Translation) citing document 1 therein, 13 pages.
(Continued)

*Primary Examiner* — Jason L McCormack
(74) *Attorney, Agent, or Firm* — Oblon, McClelland, Maier & Neustadt, L.L.P.

(57) ABSTRACT

The present disclosure is related to a Schottky thermal field (TFE) source for emitting an electron beam. Electron optics can adjust a shape of the electron beam before the electron beam impacts a scintillator screen. Thereafter, the scintillator screen generates an emission image in the form of light. An emission image can be adjusted and captured by a camera sensor in a camera at a desired magnification to create a final image of the Schottky TFE source's tip. The final image can be displayed and analyzed to for defects.

13 Claims, 7 Drawing Sheets

(51) Int. Cl.
  *H01J 37/073* (2006.01)
  *H01J 37/12* (2006.01)
  *H01J 37/26* (2006.01)

(52) U.S. Cl.
  CPC ............ *H01J 37/12* (2013.01); *H01J 37/224* (2013.01); *H01J 37/263* (2013.01); *G01N 2223/20* (2013.01); *G01N 2223/401* (2013.01); *G01N 2223/418* (2013.01); *H01J 2237/06316* (2013.01); *H01J 2237/2443* (2013.01); *H01J 2237/282* (2013.01)

(58) Field of Classification Search
  CPC .......... H01J 37/263; H01J 2237/06319; H01J 2237/2443; H01J 2237/282; G01N 23/2251; G01N 2223/20; G01N 2223/401; G01N 2223/418
  USPC .......................................... 250/306, 307, 311
  See application file for complete search history.

(56) References Cited

U.S. PATENT DOCUMENTS

| | | | | |
|---|---|---|---|---|
| 2002/0036264 | A1* | 3/2002 | Nakasuji | H01J 37/185 250/306 |
| 2003/0006373 | A1 | 1/2003 | Koguchi | |
| 2004/0084629 | A1* | 5/2004 | Preikszas | H01J 37/145 250/311 |
| 2004/0159787 | A1 | 8/2004 | Nakasuji et al. | |
| 2006/0011835 | A1* | 1/2006 | Murakoshi | H01J 37/29 250/310 |
| 2007/0057617 | A1 | 3/2007 | Coyle | |
| 2008/0211376 | A1* | 9/2008 | Yasuda | H01J 37/075 313/414 |
| 2013/0273478 | A1* | 10/2013 | Sano | H01J 3/12 430/325 |
| 2014/0061464 | A1* | 3/2014 | Lazic | H01J 37/153 250/306 |
| 2018/0114672 | A1* | 4/2018 | Ogawa | H01J 37/023 |
| 2019/0371566 | A1 | 12/2019 | Sears | |
| 2020/0211818 | A1 | 7/2020 | Yin | |

OTHER PUBLICATIONS

M.J. Fransen, et al., "Brightness measurements of a ZrO/W Schottky electron emitter in a transmission electron Microscope", Applied Surface Science, vol. 146, 1999, pp. 357-362.

Korean Office Action dated Mar. 18, 2024, issued in Korean Application No. 10-2022-036275 (with English translation citing KR 10-2019-0134103A therein).

* cited by examiner

METHOD AND APPARATUS FOR SCHOTTKY TFE INSPECTION

CROSS-REFERENCE TO RELATED APPLICATION

This application is a division of and claims benefit under 35 U.S.C. § 120 to U.S. application Ser. No. 17/319,208, filed May 13, 2021, the entire contents of which are incorporated herein by reference.

BACKGROUND

For a Schottky thermal field emission (TFE) source, it is important to have a high-quality, sharp tip for emitting electron beams. Because electron beams generated by a Schottky TFE source are commonly used in electron microscopes, a degraded tip can lower image quality and resolution. Therefore, it is advantageous to have the ability to inspect the tip.

Figure 1:
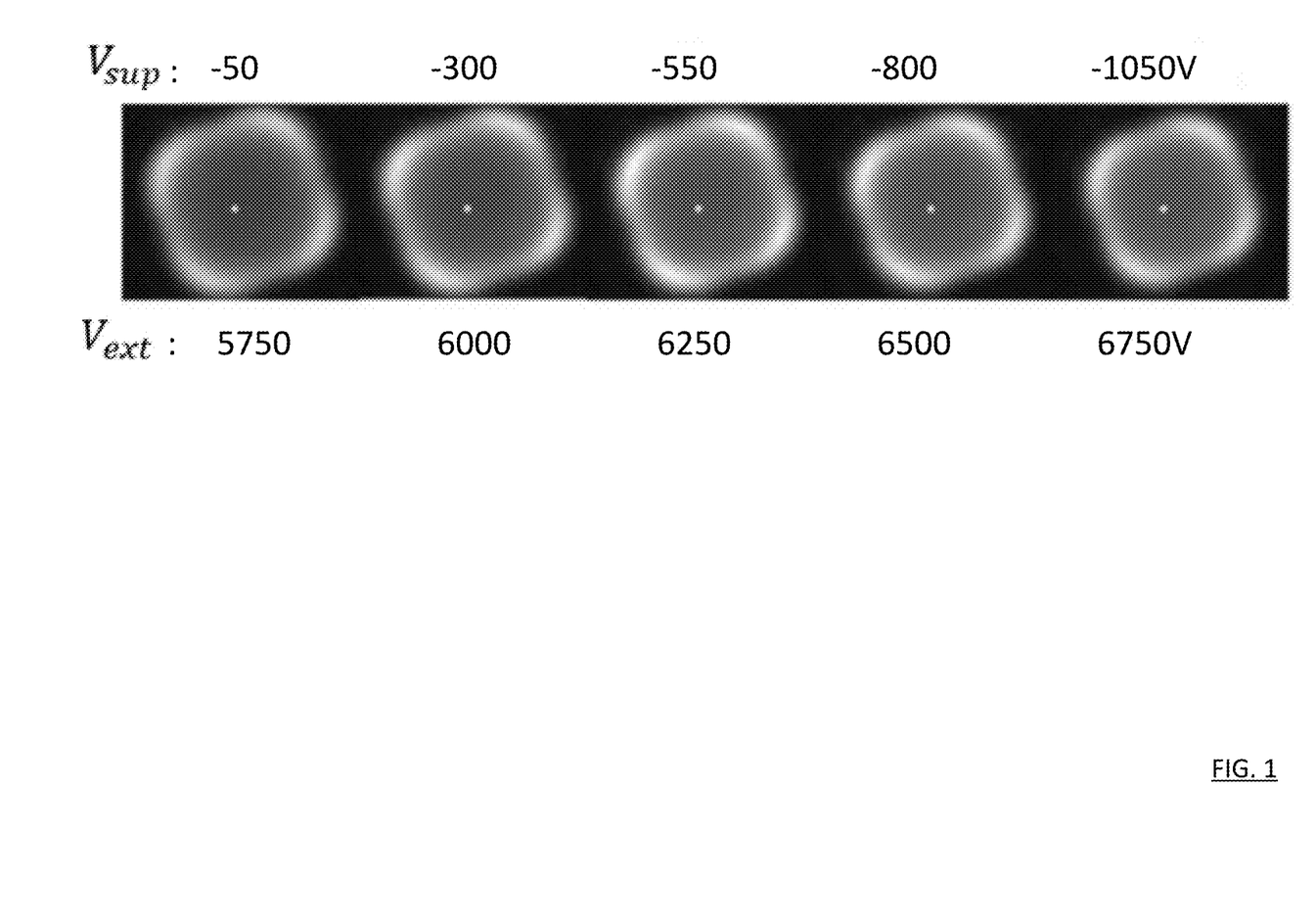
FIG. 1 illustrates a series of conventional images of a Schottky TFE source tip captured at various suppressor and extractor voltages.

One technique for tip inspection involves an electron beam emitted by a Schottky TFE source that diverges in drift space and strikes a scintillator screen. The screen creates a point-source projection/shadow image of the tip, and a camera located on the opposite side of the screen can capture said point-source projection/shadow image. The screen is also equipped with mechanically-scanning Faraday Cup for electron beam cross-section characterization. The point-source projection image on the screen may be observed visually or with optics, but it is mostly blocked off by the Faraday Cup. FIG. 1 illustrates various images captured using such a techniques at various suppressor ($V_{sup}$) and extractor ($V_{ext}$) voltages. As can be seen, the images are of poor quality. The images do not show details of the emission pattern at the Schottky TFE tip, and do not show details of the tip geometry. Essentially, the images here serve just as an indicator of the electron beam being incident on the screen. Detailed information, such that a quality image and ability to inspect the quality of the Schottky TFE tip, cannot be obtained by this technique.

SUMMARY

The present disclosure is directed to an inspection system, comprising: a Schottky TFE source having a tip manufactured/fabricated to emit an electron beam; electron optics configured to adjust a shape of the electron beam and to generate an adjusted electron beam, the electron optics being disposed adjacent to the tip; a scintillator screen configured to generate an emission image when exposed to the adjusted electron beam, the scintillator screen being disposed adjacent to the electron optics and along a trajectory path of the adjusted electron beam; a microscope configured to adjust a magnification of the emission image and to generate an adjusted emission image, the microscope being disposed adjacent to the scintillator screen and along the trajectory path of the adjusted electron beam; a camera comprising a camera sensor, configured to generate a final image from the adjusted emission image, the camera being disposed adjacent to the microscope, and the camera sensor being disposed along the trajectory path of the adjusted electron beam; and a vacuum chamber, wherein the Schottky TFE source, the electron optics, and the scintillator screen are located inside the vacuum chamber, and the microscope and the camera are located outside the vacuum chamber.

One embodiment further comprises processing circuitry, electrically connected to at least one of the Schottky TFE source, the scintillator screen, the electron optics, the microscope, and the camera, the processing circuitry being configured to control the Schottky TFE source to emit the electron beam, apply a voltage setting to the electron optics, apply a magnification setting to the microscope, and control the camera to capture the final image.

In one embodiment, the processing circuitry is further configured to tune at least one of the voltage setting and the magnification setting until the final image has desired image characteristics.

In one embodiment, the electron optics includes an electrostatic lens with two or more electrodes.

In one embodiment, the electron optics includes a three-electrode electrostatic lens.

In one embodiment, a first electrode from the three-electrode electrostatic lens is set to 2,000 volts, a second electrode from the three-electrode electrostatic lens is set to 600 volts, and a third electrode from the three-electrode electrostatic lens is set between 250 and 450 volts, the first electrode located closest to the Schottky TFE source, the third electrode located furthest from the Schottky TFE source, and the second electrode located between the first electrode and the third electrode.

In one embodiment, the adjusted electron beam is a near-collimated electron beam.

In one embodiment, the processing circuitry is further configured to analyze the final image and identify defects of the tip.

One embodiment further comprises a display configured to display the final image, the display electrically connected to the camera.

In one embodiment, the camera is at least one of a charge-coupled (CCD) camera and a complementary metal oxide semiconductor (CMOS) camera.

The present disclosure is also directed to an image generation method comprising: forming an electron beam using a Schottky TFE source, wherein the Schottky TFE source includes a tip and the electron beam is emitted from the tip; adjusting the electron beam to form a near-collimated electron beam by applying a voltage setting to electron optics; generating an emission image by exposing a scintillator screen to the near-collimated electron beam; adjusting a magnification of the emission image, using a microscope, to form an adjusted emission image on a camera sensor in a camera; and generating a final image of the adjusted emission image.

One embodiment further comprises tuning at least one of the voltage setting and the magnification until the final image has desired image characteristics.

One embodiment further comprises analyzing the final image to determine whether or not the tip is defective.

In one embodiment, the Schottky TFE source, the electron optics, and the scintillator screen are inside a vacuum chamber, and the microscope and the camera are outside the vacuum chamber.

In one embodiment, the electron optics for performing the adjusting is located between the tip and the scintillator screen.

In one embodiment, the electron optics includes an electrostatic lens with two or more electrodes.

In one embodiment, the electron optics includes a three-electrode electrostatic lens.

In one embodiment, a first electrode from the three-electrode electrostatic lens is set to 2,000 volts, a second electrode from the three-electrode electrostatic lens is set to 600 volts, and a third electrode from the three-electrode electrostatic lens is set between 250 and 450 volts, the first electrode located closest to the Schottky TFE source, the third electrode located furthest from the Schottky TFE source, and the second electrode located between the first electrode and the third electrode.

One embodiment further comprises displaying the final image.

In one embodiment, the camera is at least one of a CCD camera and a CMOS camera.

DETAILED DESCRIPTION

This disclosure is related to methods and systems for Schottky TFE tip inspection. In one embodiment, the system and methods include a Schottky TFE source for forming an electron beam, electron optics for adjusting a shape of the electron beam onto a scintillator screen to form an emission image of the Schottky TFE source's tip, and a camera/microscope pair for obtaining a final image of the tip at a desired magnification. Such techniques enable acquiring higher-resolution images at controllable magnifications, which can subsequently be used to identify emission and structural defects.

Figure 2:
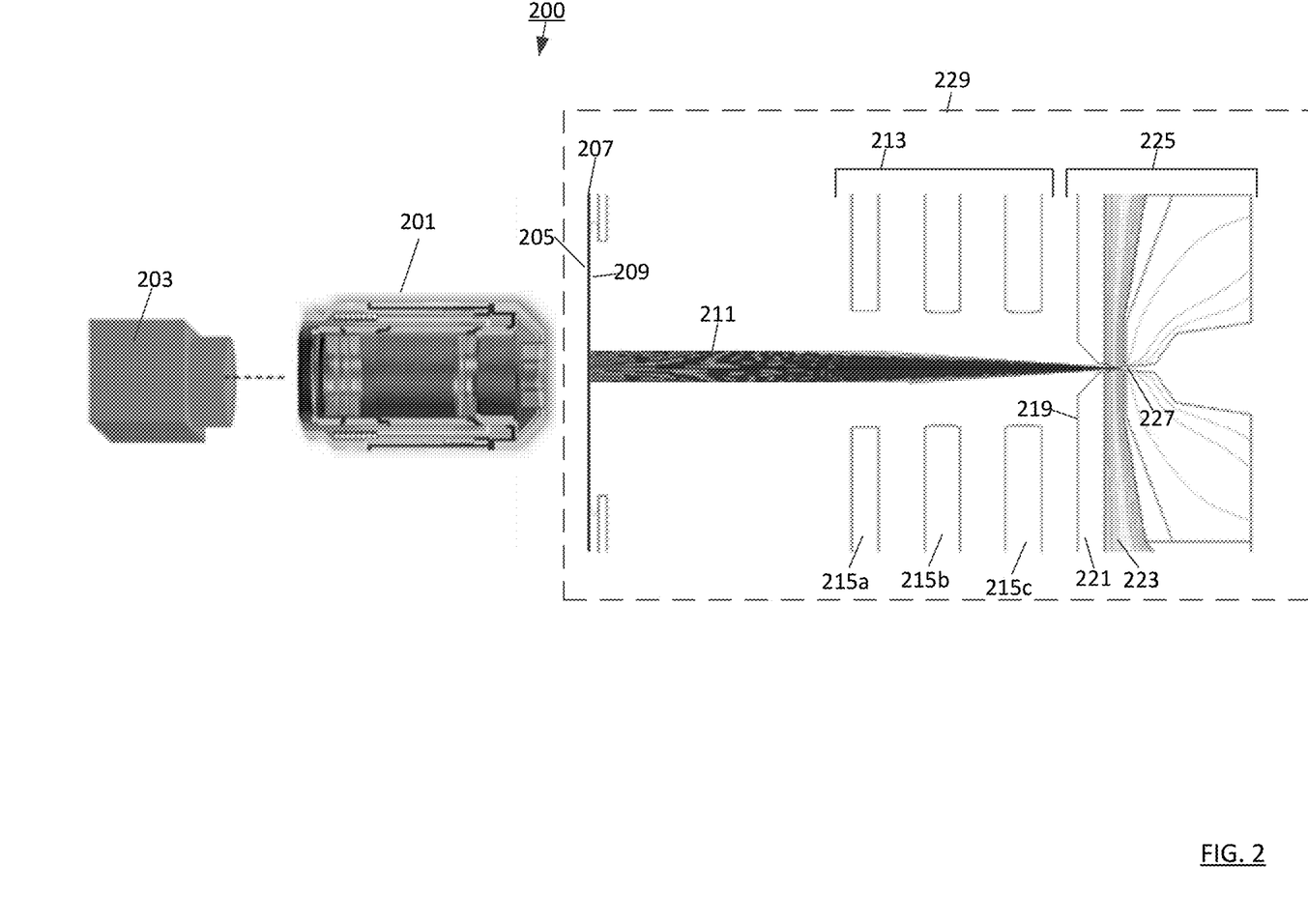
FIG. 2 illustrates a system for inspecting a Schottky TFE source tip, according to one embodiment of the present disclosure.

FIG. 2 is an illustration of a system 200, according to one exemplary aspect of the present disclosure. A Schottky TFE source 225, which includes an aperture plate 219, extractor 221, suppressor 223, and tip 227, is shown. The Schottky TFE source 225 is configured to generate an electron beam 211 directed towards electron optics 213. The electron beam 211 initially diverges, forming a cone shaped beam.

Electron optics 213 are located between the Schottky TFE source 225 and a first side 209 of the scintillator screen 207. The electron optics 213 includes an electrostatic lens having three electrodes 215a, 215b, 215c configured to adjust a shape of the electron beam 211 by generating an electric field. The electric field created via the electron optics 213 can be controlled by varying the voltage settings applied to the electrodes 215a, 215b, 215c. In one embodiment, voltage settings can be applied to the electrodes 215a, 215b, 215c to generate an electric field that near-collimates the electron beam 211, thereby forming an adjusted (i.e., near-collimated) electron beam. Examples of voltage settings that can be applied to the three electrodes 215c, 215b, 215a, respectively, include: (1) 2,000V, 600V, 350V to create a 3 millimeter diameter image at the scintillator screen 207; (2) 2,000V, 600V, 450V to create a 5 millimeter diameter (magnified) image at the scintillator screen 207; and (3) 2,000V, 600V, 250V to create a 2 millimeter diameter (de-magnified) image at the scintillator screen 207. In these examples, only the voltage of electrode 215a was adjusted (increased to magnify image, decreased to de-magnify image), though such adjustments can be made to any one or combination of electrodes 215a, 215b, 215c in other embodiments.

A scintillator screen 207 is located adjacent to the electron optics 213 and along a trajectory path of the electron beam 211 so that after collimating, the electron beam 211 strikes a first side 209 of the scintillator screen 207. The scintillator screen 207 emits light when impacted by the electron beam 211, the emitted light referred to hereinafter as an emission image.

A camera 203, which includes a camera sensor, and a microscope 201 are also shown in FIG. 2. In one embodiment, the microscope 201 can be an optical microscope to optically magnify an emission image, though in other embodiments any type of microscope can be used. The microscope 201 is located adjacent to a second side 205 of the scintillator screen 207 and is configured to adjust a trajectory of the emission image generated from the scintillator screen 207 onto the camera sensor plane in the camera 203. The microscope 201 is able to provide a flexible optical interface between the scintillator screen 207 and camera 203, in order the fill the camera sensor, having a fixed size, with the emission image at a desired magnification (e.g., magnify a specific part of the emission image onto the camera sensor, and fit/maintain full emission image onto camera sensor). The magnification of the emission image is done so as to enable a defect on a to-be-inspected Schottky TFE source tip to be picked up by a camera. The camera 203 is configured to generate a final image of the tip 227 from the microscope-adjusted emission image on its camera sensor. In one embodiment, the camera 203 can be a charge-coupled device (CCD) camera. In another embodiment, the camera can be a complementary metal oxide semiconductor (CMOS) camera. In another embodiment, the camera has a resolution (pixel size) less than or equal to 1.5 microns. Further, the camera 203 can be configured to have specific settings, such as a particular exposure time, frame rate, gain, or offset.

The Schottky TFE source 225, electron optics 213, electron beam 211, and scintillator screen 207 are located in a vacuum chamber 229 configured to maintain a vacuum state, whereas the microscope 201 and camera 203 are located outside the vacuum chamber 229.

With incorporation of the microscope 201 and electron optics 213, image characteristics of the final image, such as the size and resolution of the image captured by the camera 203, can be controlled. For example, if a larger image needs to be captured, the electron beam 211 can be widened by adjusting the voltage(s) on electron optics 213. As another example, if a more detailed image needs to be captured, the microscope 201 can alter the trajectory of the emission image to be larger on the camera sensor. As another example, if the final image generated by the camera 203 is too large, the electron optics 213 can decrease the electron beam's 211 width, or the microscope 201 can alter the emission image to be smaller on the camera sensor.

Utilizing the electron optics 213, for electro-optically magnifying, and the microscope 201, for optically magnifying, together can achieve images with more detail than in certain scenarios where only one of the electron optics 213 or microscope 201 is used. For example, if an image is electron-optically magnified by 10,000× without being optically magnified, emission image would not fit into camera sensor area, and many details would be lost. As another example, if an image is optically magnified by 400× without being electro-optically magnified, an image equal in magnification as the tip, or 1×, is projected onto the scintillator screen. The image size at the scintillator screen would be ~300 nm, which is smaller than the dominant wavelength of scintillator light, i.e., 550 nm. In such a case, an object smaller than the wavelength of light cannot be imaged and resolved.

In one embodiment, the size and resolution of the image can be controlled by configuring a magnification setting of the microscope 201 and/or a voltage setting of the electron optics 213 beforehand using predetermined settings (e.g., from a look-up table). In such a scenario, a final image having desired image characteristics, such as a specific size or resolution, can be obtained without needing any additional tuning. In another embodiment, the magnification setting and/or voltage setting can be tuned in real-time until the final image has desired image characteristics. In one exemplary scenario, a user can view an initial final image, and tune the microscope and/or electron optics to tweak the final image until it has a desirable size and resolution.

As can be appreciated by one of skill in the art, many variations can exist. For example, in one embodiment, the electron optics can include an electrostatic lens with one electrode. In another embodiment, the electron optics can include an electrostatic lens having a plurality of electrodes (e.g., 2, 3, 4, 5, etc.).

In one embodiment, the final image captured by the camera can be displayed. For example, a display can display the final image to an inspector for visually inspecting the tip. Any display type can be used, such as a liquid crystal display (LCD) or light-emitting diode (LED) display.

In another embodiment, a machine learning algorithm can be applied to the final image to determine whether or not the tip is defective. Factors such as the color, shape, and smoothness of the final image can be analyzed. In one embodiment, the machine learning algorithm can compare the final image to a reference image of a non-defective tip for determining if the final image is sufficiently similar. Further, in the case that the tip is determined to be defective, an alert can be signaled (e.g., for a user to replace tip).

In one embodiment, the electron beam generated by the Schottky TFE source is cone-shaped, and the electron optics near-collimates the electron beam.

In one embodiment, the camera and microscope are formed together as one unit (e.g., digital camera with zoom capability), which can enable portability. In another embodiment, the camera and microscope are separate units, which can enable more flexibility in choosing and/or replacing parts. In another embodiment, the microscope can be omitted.

In one embodiment, the microscope can have the capability to magnify the emission image by 0.5×-4× onto the camera sensor. Of course, in other embodiments the zoom capability can be more or less.

In one embodiment, the scintillator includes yttrium aluminum garnet (YAG) and/or phosphorous. In cases where a higher resolution emission image is desirable, the scintillator can have thinned-down crystals.

In the case that the tip is angled off axis or the electron emission point is slightly off center, emitter trajectories need not be intercepted. In one embodiment, the system (e.g., system 200) numerical aperture is greater than 120 mrad semi-angle, or ~7 degrees.

Figure 3:
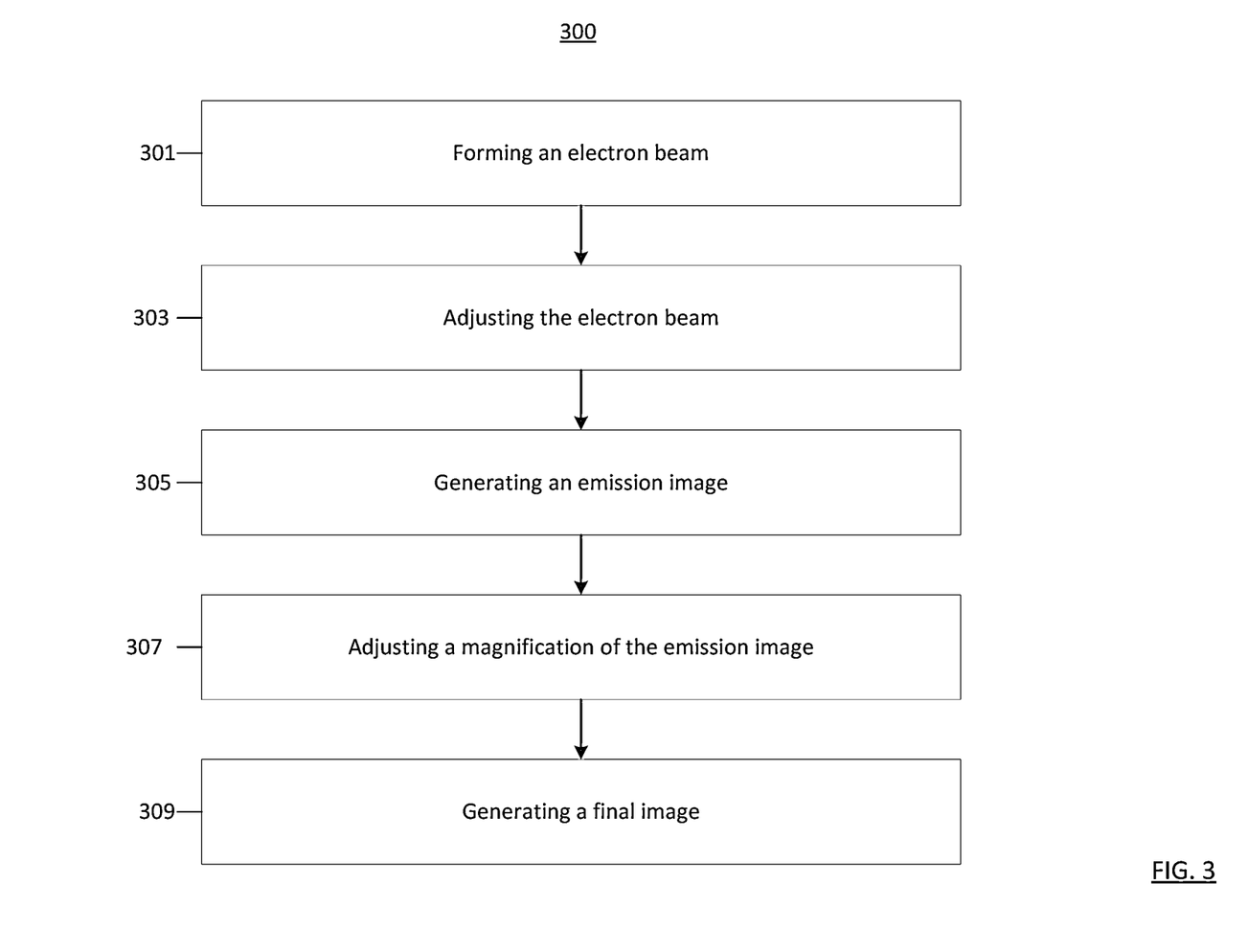
FIG. 3 is a flowchart of a method for generating a high quality image of a Schottky TFE source tip, according to one embodiment of the present disclosure.

It can be appreciated that the present disclosure can also be viewed as a method. FIG. 3 is a flowchart illustrating a method 300 according to one embodiment.

Step 301 is forming an electron beam. The electron beam can be formed using a Schottky TFE source (e.g., Schottky TFE source 225), wherein the Schottky TFE source includes a tip and the electron beam is emitted from the tip. As the electron beam is emitted, the beam spreads out (i.e., diverges) due to its emission velocity and the Boersch effect.

Step 303 is adjusting the electron beam. Electron optics (e.g., electron optics 213), having two or more electrodes, can control the shape and size of the electron beam. This controlled electron beam is directed towards a scintillator screen. In one embodiment, the electron optics near-collimates the electron beam. Various voltage settings, such as those discussed previously, can be applied to the electron optics for performing the collimating and achieving a particular beam size. Though using two or more electrodes desirable in that it offers more flexibility, one electrode can be used in certain applications. In one embodiment, three electrodes are used.

Step 305 is generating an emission image. Once the scintillator screen (e.g., scintillator screen 207) is exposed to the beam-shaped electron beam, it generates light, referred to herein as the emission image. The microscope is trained at the emission image.

Step 307 is adjusting a magnification of the emission image. Put another way, a trajectory of the light emitted by the scintillator screen is adjusted. This can be performed by a microscope (e.g., microscope 201) as the emission image passes through one or more lenses located in the microscope. The magnification can be adjusted as to image the emission image onto a camera sensor in a camera with the desired magnification.

Step 309 is generating a final image. After the microscope has adjusted the magnification of the emission image to a desired magnification onto the camera sensor, the camera (e.g., camera 203) can transform this adjusted emission image into a final image.

In one embodiment, method 300 can further comprise tuning voltage settings of the electron optics and/or magnification settings of the microscope. This tuning can occur until the final image has a desired image characteristic, such as a particular image size or resolution. In cases where the voltage setting and magnification setting are already known (e.g., from a look-up table), tuning is not necessary.

It can be appreciated that method 300 is one exemplary embodiment, and variations can exist. The variations discussed with reference to system 200 in FIG. 2 can be applied to method 300, and vice versa. Furthermore, processing circuitry configured to perform all or portions of method 300 can be connected to one or more system components in system 200.

Figure 4A:
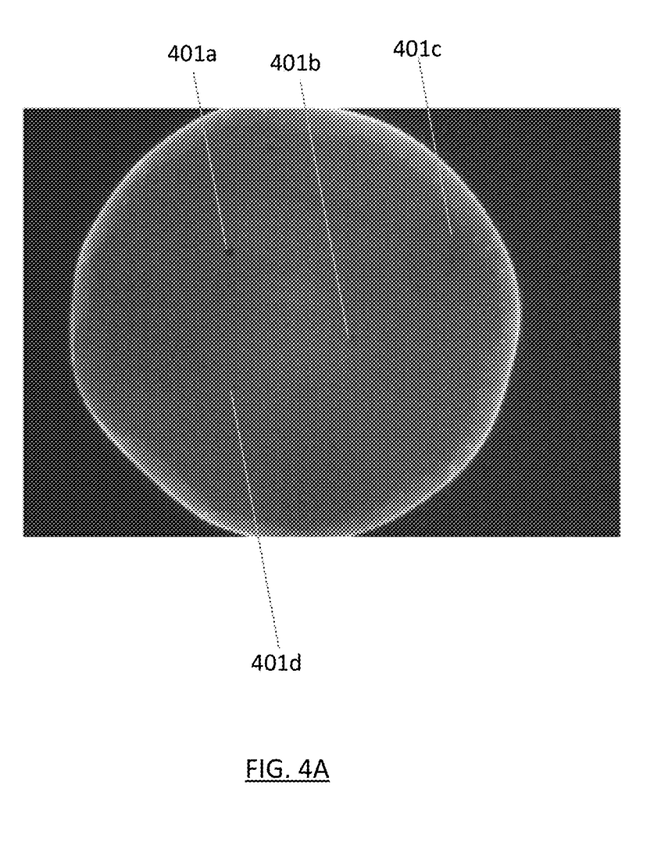
FIG. 4A is a first image of a Schottky TFE source tip captured using techniques described herein, according to one embodiment of the present disclosure.
Figure 4B:
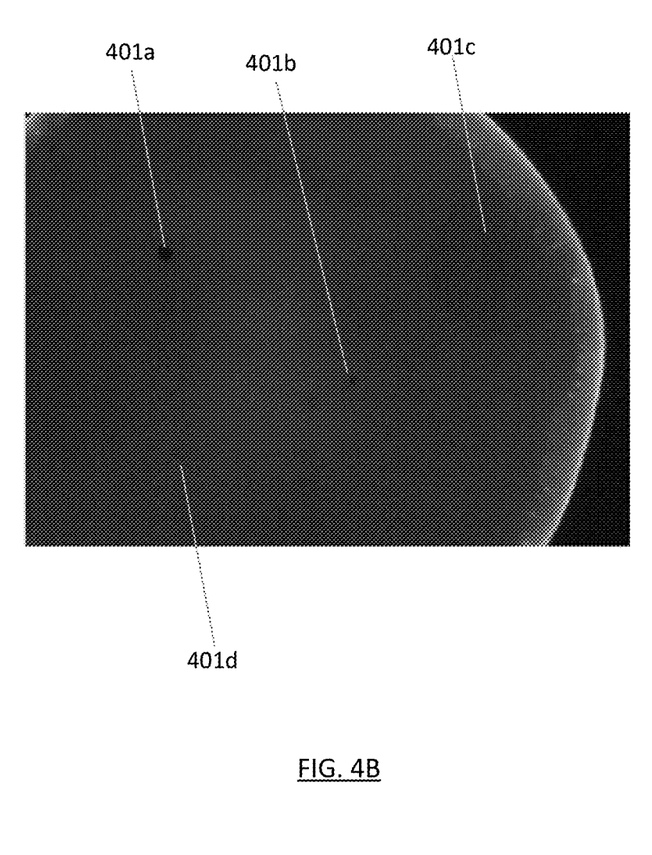
FIG. 4B is a second image of the same Schottky TFE source tip from FIG. 4A captured using techniques described herein, according to one embodiment of the present disclosure.

FIGS. 4A and 4B are examples of images that can be captured using the above described systems and methods. FIG. 4A shows a full-size, final image of a 0.9 μm Schottky TFE tip, as shown on a computer display. The image size on the computer display is 270 mm and has the screen size of 4,000 pixels. FIG. 4B shows a magnified segment of the same Schottky TFE tip from FIG. 4A.

As can be seen, the images captured in FIGS. 4A and 4B are of much higher quality than the conventional images shown in FIG. 1. Artifacts 401a, 401b, 401c, 401d, such as particulate contamination and scintillator screen defects, can be seen in FIGS. 4A and 4B.

Figure 4C:
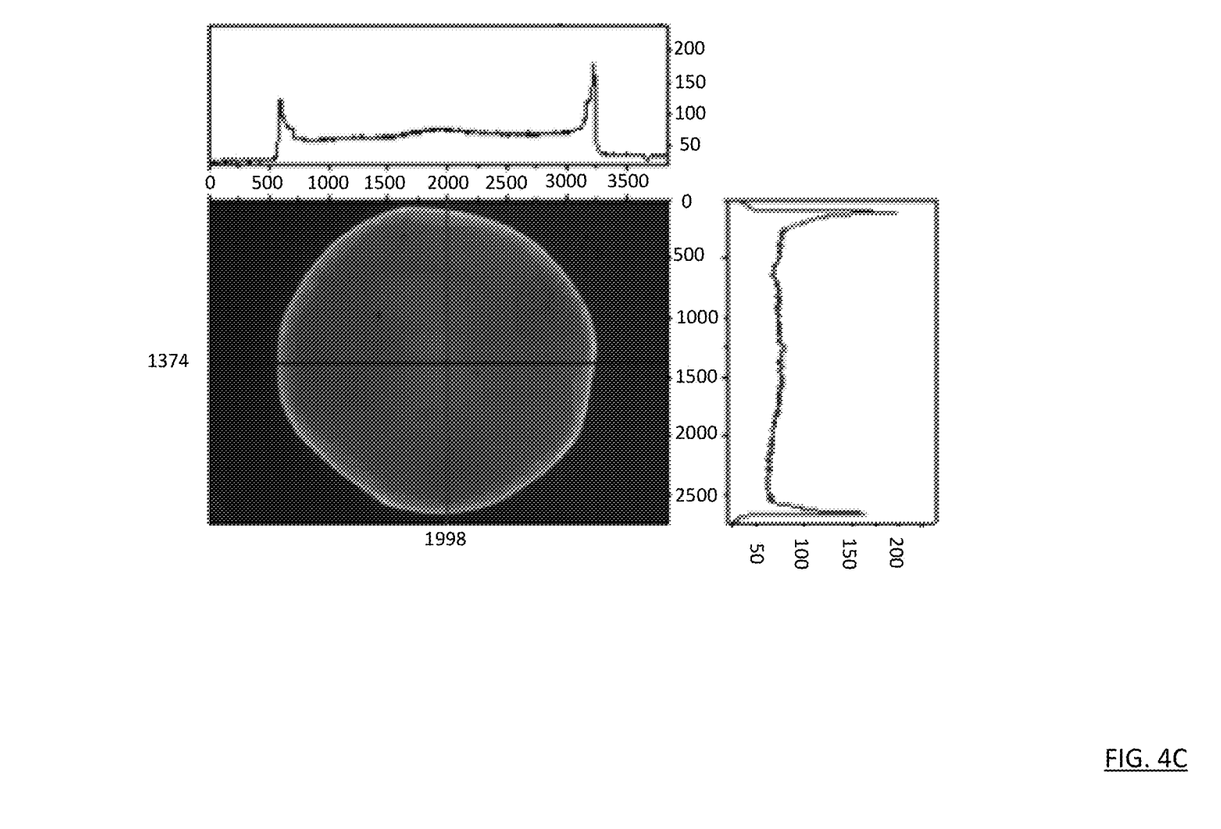
FIG. 4C is an image of a Schottky TFE source tip captured using the techniques described herein and its emission profile, according to one embodiment of the present disclosure.
Figure 5A:
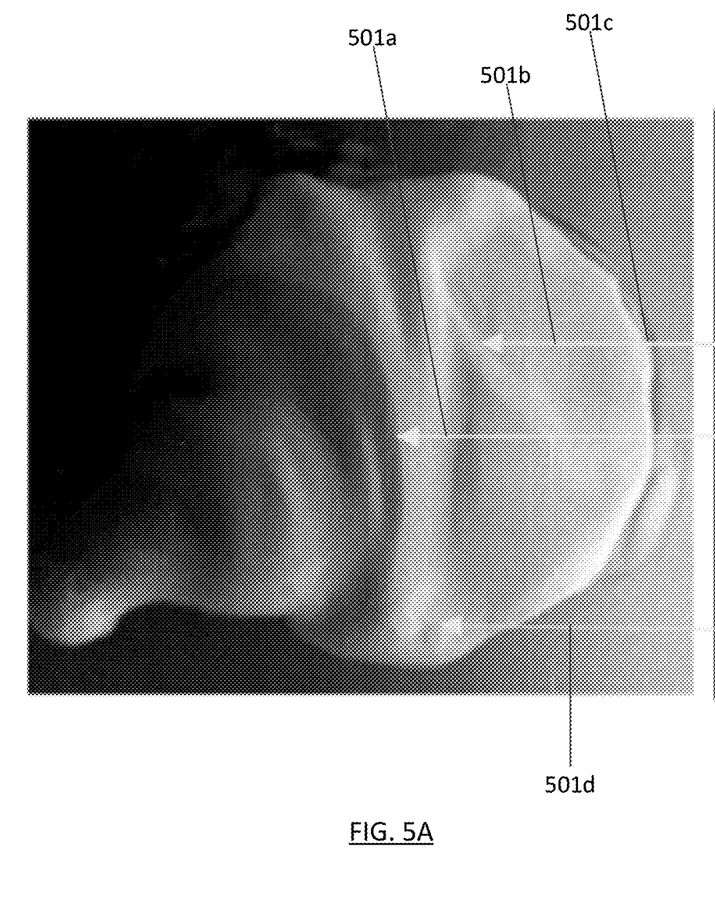
FIG. 5A is an image of a defective Schottky TFE source tip captured using a scanning electron microscope (SEM).
Figure 5B:
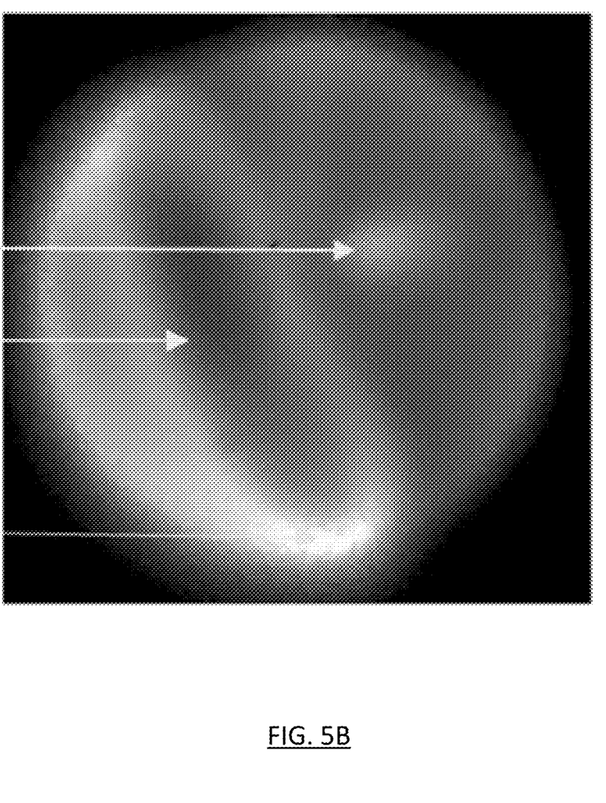
FIG. 5B is an image of the defective Schottky TFE source tip from FIG. 5A captured using techniques described herein, according to one embodiment of the present disclosure.

FIG. 4C shows another image of a Schottky TFE tip, similar to the Schottky TFE tip from FIGS. 4A and 4B, along with emission profiles. The emission profiles show strong edges, indicated by the typical Schottky dog ears As previously mentioned, it is desirable to know whether a tip is defective. FIG. 5A shows an image of a defective tip captured by a scanning electron microscope (SEM). As can be seen, the tip is dull and of poor quality. FIG. 5B shows an example of a final image of the defective tip captured using the techniques described above. The arrows 501a, 501b, 501c, 501d between FIGS. 5A and 5B indicate corresponding elements. Compared to the final images of the non-defective tip shown in FIGS. 4A and 4B, the final image shown in FIG. 5B shows a much lower-quality tip than the one shown in FIGS. 4A and 4B. The final image in FIG. 5B is non-uniform, indicating that damage to the tip can be suspected, such a suspicion having been confirmed in this example by the captured SEM image shown in FIG. 5A.

Figure 6A:
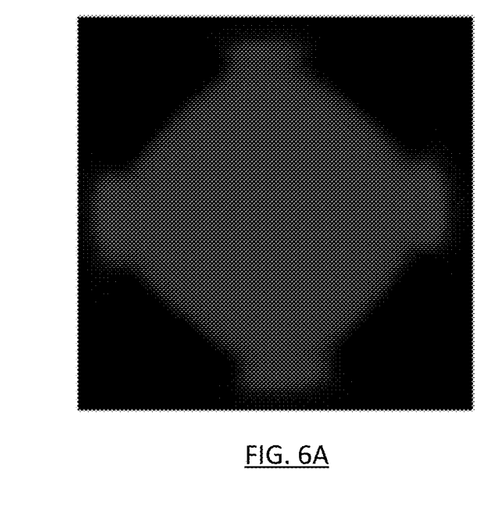
FIG. 6A is an image of a Schottky TFE source tip captured using the techniques described herein, according to one embodiment of the present disclosure.
Figure 6B:
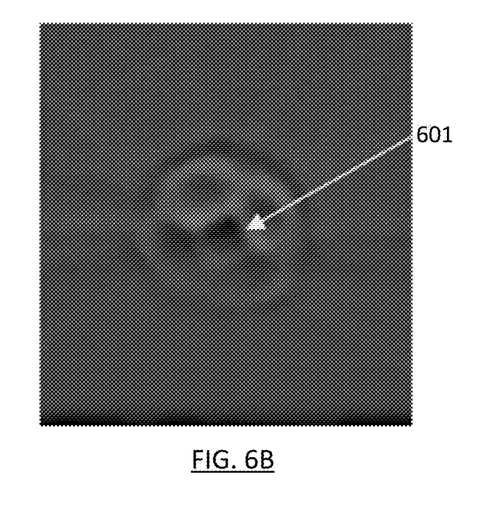
FIG. 6B is an image of the Schottky TFE source tip captured using a SEM.

FIG. 6A is an additional exemplary final image of a non-defective, square Schottky TFE tip captured using the techniques described above. FIG. 6B shows an image of the non-defective, square Schottky TFE tip from FIG. 6A captured by a SEM, where the arrow 601 notes the (100) crystalline plane surrounded by four (110) planes.

The method described herein can be implemented in a number of technologies but generally relate to processing circuitry for performing the techniques (e.g., method 300) described herein. In one embodiment, the processing circuitry is implemented as one of or as a combination of: an application specific integrated circuit (ASIC), a field programmable gate array (FPGA), a generic array of logic (GAL), a programmable array of logic (PAL), circuitry for allowing one-time programmability of logic gates (e.g., using fuses) or reprogrammable logic gates. Furthermore, the processing circuitry can include a computer processor and having embedded and/or external non-volatile computer readable memory (e.g., RAM, SRAM, FRAM, PROM, EPROM, and/or EEPROM) that stores computer instructions (binary executable instructions and/or interpreted computer instructions) for controlling the computer processor to perform the processes described herein. The computer processor circuitry may implement a single processor or multiprocessors, each supporting a single thread or multiple threads and each having a single core or multiple cores.

In the preceding description, specific details have been set forth, such as a particular method and system for capturing images of a Schottky TFE source tip. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the claims.

Embodiments of the present disclosure may also be set forth in the following parentheticals.

(1) An inspection system, comprising: a Schottky thermal field emission (TFE) source having a tip configured to emit an electron beam; electron optics configured to adjust a shape of the electron beam and to generate an adjusted electron beam, the electron optics being disposed adjacent to the tip; a scintillator screen configured to generate an emission image when exposed to the adjusted electron beam, the scintillator screen being disposed adjacent to the electron optics and along a trajectory path of the adjusted electron beam; a microscope configured to adjust a magnification of the emission image and to generate an adjusted emission image, the microscope being disposed adjacent to the scintillator screen and along the trajectory path of the adjusted electron beam; a camera comprising a camera sensor, configured to generate a final image from the adjusted emission image, the camera being disposed adjacent to the microscope, and the camera sensor being disposed along the trajectory path of the adjusted electron beam; and a vacuum chamber, wherein the Schottky TFE source, the electron optics, and the scintillator screen are located inside the vacuum chamber, and the microscope and the camera are located outside the vacuum chamber.

(2) The system of (1), further comprising processing circuitry, electrically connected to at least one of the Schottky TFE source, the scintillator screen, the electron optics, the microscope, and the camera, the processing circuitry being configured to control the Schottky TFE source to emit the electron beam, apply a voltage setting to the electron optics, apply a magnification setting to the microscope, and control the camera to capture the final image.

(3) The system of any of (1) to (2), wherein the processing circuitry is further configured to tune at least one of the voltage setting and the magnification setting until the final image has desired image characteristics.

(4) The system of any of (1) to (3), wherein the electron optics includes an electrostatic lens with two or more electrodes.

(5) The system of any of (1) to (4), wherein the electron optics includes a three-electrode electrostatic lens.

(6) The system of any of (1) to (5), wherein a first electrode from the three-electrode electrostatic lens is set to 2,000 volts, a second electrode from the three-electrode electrostatic lens is set to 600 volts, and a third electrode from the three-electrode electrostatic lens is set between 250 and 450 volts, the first electrode located closest to the Schottky TFE source, the third electrode located furthest from the Schottky TFE source, and the second electrode located between the first electrode and the third electrode.

(7) The system of any of (1) to (6), wherein the adjusted electron beam is a near-collimated electron beam.

(8) The system of any of (1) to (7), wherein the processing circuitry is further configured to analyze the final image and identify defects of the tip.

(9) The system of any of (1) to (8), further comprising a display configured to display the final image, the display being electrically connected to the camera.

(10) The system of any of (1) to (9), wherein the camera is at least one of a charge-coupled (CCD) camera and a complementary metal oxide semiconductor (CMOS) camera.

(11) An image generation method comprising: forming an electron beam using a Schottky thermal field emission (TFE) source, wherein the Schottky TFE source includes a tip and the electron beam is emitted from the tip; adjusting the electron beam to form a near-collimated electron beam by applying a voltage setting to electron optics; generating an emission image by exposing a scintillator screen to the near-collimated electron beam; adjusting a magnification of the emission image, using a microscope, to form an adjusted emission image on a camera sensor in a camera; and generating a final image of the adjusted emission image.

(12) The method of (11), further comprising tuning at least one of the voltage setting and the magnification until the final image has desired image characteristics.

(13) The method of any of (11) to (12), further comprising analyzing the final image to determine whether or not the tip is defective.

(14) The method of any of (11) to (13), wherein the Schottky TFE source, the electron optics, and the scintillator screen are inside a vacuum chamber, and the microscope and the camera are outside the vacuum chamber.

(15) The method of any of (11) to (14), wherein the electron optics for performing the adjusting is disposed between the tip and the scintillator screen.

(16) The method of any of (11) to (15), wherein the electron optics includes an electrostatic lens with two or more electrodes.

(17) The method of any of (11) to (16), wherein the electron optics includes a three-electrode electrostatic lens.

(18) The method of any of (11) to (17), wherein a first electrode from the three-electrode electrostatic lens is set to 2,000 volts, a second electrode from the three-electrode electrostatic lens is set to 600 volts, and a third electrode from the three-electrode electrostatic lens is set between 250 and 450 volts, the first electrode located closest to the Schottky TFE source, the third electrode located furthest from the Schottky TFE source, and the second electrode located between the first electrode and the third electrode.

(19) The method of any of (11) to (17), further comprising displaying the final image.

(20) The method of any of (11) to (18), wherein the camera is at least one of a CCD camera and a CMOS camera.

The invention claimed is:

1. An image generation method, comprising:
forming an electron beam using a Schottky thermal field emission (TFE) source, wherein the Schottky TFE source includes a tip and the electron beam is emitted from the tip;
adjusting the electron beam as the electron beam exited the Schottky TFE source to form an adjusted electron beam by applying a voltage setting to electron optics;
generating an emission image of the tip of the Schottky TFE source by exposing a scintillator screen to the adjusted electron beam as the adjusted electron beam exited the electron optics;
adjusting a magnification of the emission image, using a microscope, to form an adjusted emission image on a camera sensor in a camera; and
generating a final image of the adjusted emission image.

2. The method of claim 1, further comprising tuning at least one of the voltage setting and the magnification until the final image has desired image characteristics.

3. The method of claim 1, further comprising analyzing the final image to determine whether or not the tip is defective.

4. The method of claim 1, wherein
the Schottky TFE source, the electron optics, and the scintillator screen are inside a vacuum chamber, and
the microscope and the camera are outside the vacuum chamber.

5. The method of claim 4, wherein the electron optics for performing the adjusting is located between the tip and the scintillator screen.

6. The method of claim 1, wherein the electron optics includes an electrostatic lens with two or more electrodes.

7. The method of claim 1, wherein the electron optics includes a three-electrode electrostatic lens.

8. The method of claim 7, wherein
a first electrode from the three-electrode electrostatic lens is set to 2,000 volts,
a second electrode from the three-electrode electrostatic lens is set to 600 volts,
a third electrode from the three-electrode electrostatic lens is set between 250 and 450 volts,
the first electrode is located closest to the Schottky TFE source,
the third electrode is located furthest from the Schottky TFE source, and
the second electrode is located between the first electrode and the third electrode.

9. The method of claim 1, further comprising displaying the final image.

10. The method of claim 1, wherein the camera is at least one of a CCD camera and a CMOS camera.

11. The method of claim 1, wherein the adjusted electron beam is a collimated electron beam.

12. An image generation method, comprising:
forming an electron beam using a Schottky thermal field emission (TFE) source, wherein the Schottky TFE source includes a tip and the electron beam is emitted from the tip;
adjusting the electron beam to form an adjusted electron beam by applying a voltage setting to electron optics;
generating an emission image by exposing a scintillator screen to the adjusted electron beam as it exited the electron optics;
adjusting a magnification of the emission image, using a microscope, to form an adjusted emission image on a camera sensor in a camera;

generating a final image of the adjusted emission image; and analyzing the final image to determine whether or not the tip is defective.

13. The method of claim 12, comprising:

adjusting the electron beam as the electron beam exits the Schottky TFE source to form an adjusted electron beam by applying a voltage setting to electron optics; and generating an emission image by exposing a scintillator screen to the adjusted electron beam.

\* \* \* \* \*